US009365934B2

(12) United States Patent
Adaniya et al.

(10) Patent No.: US 9,365,934 B2
(45) Date of Patent: Jun. 14, 2016

(54) LIQUID COMPOSITION USED IN ETCHING COPPER- AND TITANIUM-CONTAINING MULTILAYER FILM, ETCHING METHOD IN WHICH SAID COMPOSITION IS USED, METHOD FOR MANUFACTURING MULTILAYER-FILM WIRING, AND SUBSTRATE

(71) Applicant: MITSUBISHI GAS CHEMICAL COMPANY, INC., Chiyoda-ku (JP)

(72) Inventors: Tomoyuki Adaniya, Tokyo (JP); Kunio Yube, Tokyo (JP); Satoshi Tamai, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 14/783,370

(22) PCT Filed: Mar. 31, 2014

(86) PCT No.: PCT/JP2014/059416
§ 371 (c)(1),
(2) Date: Oct. 8, 2015

(87) PCT Pub. No.: WO2014/168037
PCT Pub. Date: Oct. 16, 2014

(65) Prior Publication Data
US 2016/0053384 A1    Feb. 25, 2016

(30) Foreign Application Priority Data

Apr. 12, 2013   (JP) .................................. 2013-083576

(51) Int. Cl.
H05K 1/09     (2006.01)
C23F 1/26     (2006.01)
C23F 1/18     (2006.01)
H05K 1/02     (2006.01)
H05K 3/06     (2006.01)

(52) U.S. Cl.
CPC ... C23F 1/26 (2013.01); C23F 1/18 (2013.01); H05K 1/0298 (2013.01); H05K 1/09 (2013.01); H05K 3/061 (2013.01); H05K 3/067 (2013.01)

(58) Field of Classification Search
CPC ........ H01L 21/02; H01L 21/30; C09K 13/00; C09K 13/06; C23F 1/10; C11D 7/34; C11D 7/36
USPC .......... 174/257; 510/175; 438/691; 252/79.1, 252/79.2, 79.4; 134/2, 3, 26
See application file for complete search history.

(56) References Cited

U.S. PATENT DOCUMENTS

| | | | | |
|---|---|---|---|---|
| 4,376,057 A * | 3/1983 | Angelo | .................. | C09K 13/06 216/108 |
| 7,247,208 B2 * | 7/2007 | Hsu | ......................... | C11D 1/62 134/2 |
| 7,253,111 B2 * | 8/2007 | Liu | .......................... | C09G 1/02 106/14.05 |
| 2003/0107023 A1 | 6/2003 | Chae et al. | | |
| 2007/0232513 A1 * | 10/2007 | Hsu | ......................... | C11D 1/62 510/175 |
| 2010/0291722 A1 | 11/2010 | Kim et al. | | |
| 2011/0147341 A1 | 6/2011 | Sato et al. | | |
| 2011/0226727 A1 | 9/2011 | Suh et al. | | |
| 2012/0083436 A1 * | 4/2012 | Lee | ......................... | G03F 7/426 510/175 |
| 2013/0048904 A1 | 2/2013 | Adaniya et al. | | |
| 2013/0107023 A1 | 5/2013 | Tanaka et al. | | |
| 2014/0131615 A1 | 5/2014 | Tamai et al. | | |
| 2016/0020087 A1 * | 1/2016 | Liu | .................... | C11D 11/0047 510/175 |

FOREIGN PATENT DOCUMENTS

| | | |
|---|---|---|
| CN | 101886266 A | 11/2010 |
| CN | 102149851 A | 8/2011 |
| CN | 102834547 A | 12/2012 |
| JP | 47 31838 | 11/1972 |
| JP | 60 243286 | 12/1985 |
| JP | 61 591 | 1/1986 |
| JP | 8 46331 | 2/1996 |
| KR | 2002 0097348 | 12/2002 |
| KR | 10 2011 0076468 | 7/2011 |
| WO | 2011 093445 | 8/2011 |
| WO | 2013 005631 | 1/2013 |

OTHER PUBLICATIONS

International Search Report issued Jun. 24, 2014, in PCT/JP2014/059416 filed Mar. 31, 2014.

* cited by examiner

Primary Examiner — Xiaoliang Chen
(74) Attorney, Agent, or Firm — Oblon, McClelland, Maier & Neustadt, L.L.P.

(57) ABSTRACT

The present invention provides a liquid composition used for etching a copper- and titanium-containing multilayer film, a method for etching a copper- and titanium-containing multilayer film by using said liquid composition, a method for manufacturing multilayer-film wiring according to said etching method, and a substrate provided with multilayer-film wiring manufactured according to said manufacturing method. According to the present invention, a liquid composition comprising (A) a maleic acid ion source, (B) a copper ion source and (C) a fluoride ion source and having the pH value of 0-7 is used.

15 Claims, 2 Drawing Sheets

LIQUID COMPOSITION USED IN ETCHING COPPER- AND TITANIUM-CONTAINING MULTILAYER FILM, ETCHING METHOD IN WHICH SAID COMPOSITION IS USED, METHOD FOR MANUFACTURING MULTILAYER-FILM WIRING, AND SUBSTRATE

TECHNICAL FIELD

The present invention relates to a liquid composition. More particularly, the present invention relates to a liquid composition used for etching a copper- and titanium-containing multilayer film, a method for etching a copper- and titanium-containing multilayer film by using said liquid composition, a method for manufacturing copper- and titanium-containing multilayer-film wiring according to said etching method, and a substrate manufactured according to said method for manufacturing multilayer-film wiring.

BACKGROUND ART

Conventionally, aluminum or an aluminum alloy has generally been used as a wiring material for a display device such as a flat panel display. With upsizing and resolution enhancement of the display, however, such aluminum wiring materials became to raise a problem of signal delay due to the properties thereof such as wiring resistance, causing difficulty in displaying a uniform screen.

While copper (Cu) has an advantage of lower resistance over aluminum (Al), in a case where copper is used for gate wiring, it has a problem of insufficient adhesion between the substrate (for example, a glass substrate) and the copper. In addition, in a case where copper is used for source-drain wiring, there are problems as follows: copper may diffuse into the underlying silicon semiconductor film; copper may be oxidized due to diffusion of oxygen from an oxide semiconductor film; and the like. In order to solve the above-described problems, multilayer-film wiring has been studied in which a copper layer is provided via a barrier film made of a metal having high adhesion to a substrate (for example, a glass substrate) and also having a barrier property that prevents diffusion into a semiconductor film. As metals having both adhesion and a barrier property, metals such as molybdenum (Mo) and titanium (Ti) are known. The multilayer-film wiring employs a two-layer multilayer film in which a layer made of copper and a layer made of such metal or an alloy thereof are laminated, or a three-layer multilayer film in which a layer made of a metal such as molybdenum or titanium or an alloy thereof is further laminated on said copper layer in order to prevent oxidation of the layer made of copper.

Copper- and titanium-containing multilayer-film wiring can be obtained by forming the above-described multilayer film on a substrate (for example, a glass substrate) by a film formation process such as sputtering, and subjecting the resultant to etching using a resist as a mask to form an electrode pattern.

Etching processes include wet etching that uses an etchant and dry etching that uses an etching gas such as plasma. Characteristics such as follows are required for the etchant used for wet etching:

high processing accuracy;
highly stabile and safe components and easy handling;
stable etching performance; and
good wiring configuration should result after etching.

As an etchant used in the step of etching a copper- and titanium-containing multilayer film, for example, acidic etchants containing hydrogen peroxide, carboxylic acid, carboxylic acid salt or a fluorine compound (Patent Document 1), and acidic etchants containing peroxosulfuric acid salt, an organic acid, ammonium salt, a fluorine compound, a glycol compound or an azole compound (Patent Document 2) are known.

Furthermore, as peroxide-free etchants for copper, an ammonia alkaline etchant containing a copper (II) ion and ammonia, and an acidic etchant containing a copper (II) ion and a halide ion are known. Additionally, as a peroxide-free copper etchant, etchants containing a maleic acid ion source and a copper (II) ion source are also proposed (Patent Document 3).

Moreover, as etchants used in the step of etching a copper- and titanium-containing multilayer film, etchants containing an inorganic salt-containing oxidant, an inorganic acid, and a fluoride ion source are known (Patent Document 4).

However, if an etchant containing hydrogen peroxide or peroxosulfuric acid as Patent Documents 1 and 2 is used, there are problems such as generation of gas and heat due to decomposition of hydrogen peroxide or peroxosulfuric acid, and change in the etching performance due to decomposition of the components.

In addition, although a peroxide-free copper etchant as Patent Document 3 is capable of etching copper, it has difficulty in etching titanium and thus is not appropriate as an etchant used for the step of etching a copper and titanium multilayer film.

When an etchant containing an inorganic salt-containing oxidant, an inorganic acid and a fluoride ion source as Patent Document 4 is used in the step of etching a copper- and titanium-containing multilayer film, the etching time and the wiring configuration were not good (see Comparative Examples 7-9).

PRIOR ART DOCUMENTS

Patent Documents

Patent Document 1: Specification of US Patent Application Publication No. 2003/107023
Patent Document 2: Specification of US Patent Application Publication No. 2011/226727
Patent Document 3: International Publication No. 2013/5631
Patent Document 4: Korean Patent Publication No. 2002-97348

SUMMARY OF THE INVENTION

Problems to be Solved by the Invention

Under such circumstances, there have been needs for a liquid composition used for etching a copper- and titanium-containing multilayer film, a method for manufacturing copper- and titanium-containing multilayer-film wiring by using said liquid composition, a method for manufacturing copper- and titanium-containing multilayer-film wiring according to said etching method and a substrate manufactured according to said method for manufacturing multilayer-film wiring.

Means for Solving the Problems

Recently, the present inventors found that use of a liquid composition containing a copper ion source, a maleic acid ion source and a fluoride ion source can solve the above-described problems.

Specifically, a liquid composition of the present invention is a liquid composition used for etching a multilayer film comprising a layer made of copper or a compound containing copper as a primary component and a layer made of titanium or a compound containing titanium as a primary component, the liquid composition comprising:

(A) a maleic acid ion source;
(B) a copper ion source; and
(C) a fluoride ion source, wherein the pH value is 0-7.

Furthermore, in one embodiment of the liquid composition of the present invention, the maleic acid ion source (A) may be at least one species selected from the group consisting of maleic acid and maleic anhydride, where the concentration thereof may be 0.01-5 mol/kg.

Furthermore, in one embodiment of the liquid composition of the present invention, the mix proportion of the maleic acid ion source (A) to the copper ion source (B) may be, on molar basis, in a range of 0.01-40, more preferably in a range of 0.02-20, and particularly preferably in a range of 0.1-10.

Furthermore, in one embodiment of the liquid composition of the present invention, the copper ion source (B) may be at least one species selected from the group consisting of copper, copper sulfate, copper nitrate, copper acetate and copper hydroxide, where the concentration thereof may be 0.01-5 mol/kg.

Furthermore, in one embodiment of the present invention, the fluoride ion source (C) may be at least one species selected from the group consisting of hydrofluoric acid, ammonium fluoride, ammonium acid fluoride and buffered hydrogen fluoride, where the concentration thereof may be 0.01-5 mol/kg.

Furthermore, in one embodiment of the liquid composition of the present invention, the mix proportion of the fluoride ion source (C) to the copper ion source (B) may be 0.1-10 on molar basis.

Furthermore, one embodiment of the liquid composition of the present invention may further comprise a carboxylic acid ion source (D) other than maleic acid.

Furthermore, in one embodiment of the liquid composition of the present invention, the carboxylic acid ion source (D) other than maleic acid may be at least one species selected from the group consisting of acetic acid, glycolic acid, malonic acid, succinic acid, lactic acid, citric acid, carboxylates thereof and acetic anhydride, where the concentration thereof may be 0-5 mol/kg.

Furthermore, one embodiment of the liquid composition of the present invention may further comprise a halide ion source (E) other than a fluoride ion.

Furthermore, in one embodiment of the liquid composition of the present invention, the halide ion source (E) other than a fluoride ion may be at least one species selected from the group consisting of hydrochloric acid, hydrobromic acid, ammonium chloride, potassium chloride, cupric chloride and potassium bromide, where the concentration thereof may be 0-5 mol/kg.

Furthermore, one embodiment of the liquid composition of the present invention may further comprise a pH adjuster.

An etching method according to the present invention is a method for etching a multilayer film comprising a layer made of copper or a compound containing copper as a primary component and a layer made of titanium or a compound containing titanium as a primary component, the method comprising the step of bringing the multilayer film into contact with the liquid composition.

Furthermore, in one embodiment of the etching method of the present invention, the multilayer film may be a two-layer film in which a layer made of titanium or a compound containing titanium as a primary component is laminated with a layer made of copper or a compound containing copper as a primary component.

Furthermore, in one embodiment of the etching method of the present invention, the multilayer film may be a three-layer film in which a layer made of titanium or a compound containing titanium as a primary component, a layer made of copper or a compound containing copper as a primary component and a layer made of titanium or a compound containing titanium as a primary component are laminated in this order.

A method for manufacturing multilayer-film wiring according to the present invention is a method for manufacturing multilayer-film wiring comprising at least a layer made of titanium or a compound containing titanium as a primary component and a layer made of copper or a compound containing copper as a primary component on a substrate, the method comprising the steps of:

providing a layer made of titanium or a compound containing titanium as a primary component and a layer made of copper or a compound containing copper as a primary component on the substrate to form a multilayer film;

covering the multilayer film with a resist to form a resist film;

exposing and developing the resist film to form a predetermined resist pattern, thereby forming an object to be etched; and bringing the object to be etched into contact with the liquid composition to etch the multilayer film, thereby forming multilayer-film wiring.

In addition, a substrate according to the present invention is a substrate provided with multilayer-film wiring comprising at least a layer made of titanium or a compound containing titanium as a primary component and a layer made of copper or a compound containing copper as a primary component, wherein the substrate is manufactured according to the above-described method for manufacturing multilayer-film wiring.

Effect of the Invention

The liquid composition according to the present invention is capable of etching a multilayer film containing copper and titanium together at a good etching rate (in a preferable embodiment of the present invention, the just-etch time that takes to complete the etching of the copper- and titanium-containing multilayer film to expose the base is about 30-400 seconds, which is about 0.1-10 µm/min as an etching rate).

Since the liquid composition of the present invention does not contain hydrogen peroxide or peroxosulfuric acid ion, no gas or heat is generated due to the decomposition reaction thereof, and thus etching can be carried out safely and stably.

Moreover, in a preferable embodiment of the present invention, pH value of the liquid composition of the present invention is acidic to neutral. Therefore, for example, even when ammonia is contained, no odor is generated due to volatilization of ammonia. Since it is environmentally harmless, it is easy to handle.

Accordingly, a liquid composition used for etching copper- and titanium-containing multilayer-film wiring can be realized, which is applicable to upsizing, resolution enhancement and reduction in the power consumption of the display.

In addition, in a preferable embodiment of the present invention, change in the etching rate of the liquid composition of the present invention is small even when copper or titanium is dissolved upon etching, and thus it has an advantage in use for prolonged etching.

MODES FOR CARRYING OUT THE INVENTION

Liquid Composition

Figure 1:
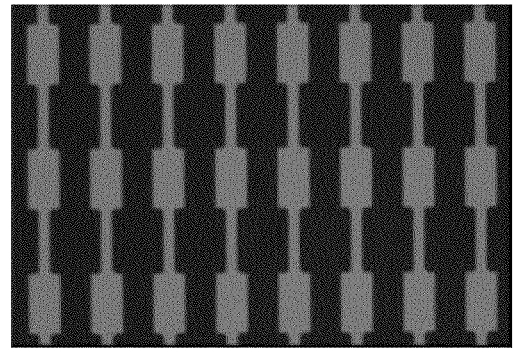
FIG. 1 An optical micrograph of a titanium/copper/titanium/glass substrate having the resist pattern obtained in Reference Example 1 formed thereon, which had been etched using the liquid composition of Example 1.

A liquid composition of the present invention is used for etching a copper- and titanium-containing multilayer film, and comprises at least (A) a maleic acid ion source, (B) a copper ion source and (C) a fluoride ion source. By using a liquid composition containing such specific components, wiring having a multilayer film structure containing copper and titanium can be etched together at a good etching rate (in a preferable embodiment of the present invention, the just-etch time is about 30-400 seconds, which is about 0.1-10 μm/min as an etching rate).

A liquid composition according to the present invention can be used to fabricate a copper- and titanium-containing multilayer film to have a good wiring configuration.

Herein, "a copper- and titanium-containing multilayer film" refers to a multilayer film comprising at least a layer made of copper or a compound containing copper as a primary component and a layer made of titanium or a compound containing titanium as a primary component. Herein, "a compound containing copper as a primary component" refers to a compound containing copper at 50% or higher, preferably 60% or higher, and more preferably 70% or higher on weight basis. "A compound containing titanium as a primary component" refers to a compound containing titanium at 50% or higher, preferably 60% or higher, and more preferably 70% or higher on weight basis.

Hereinafter, each of the components constituting the liquid composition of the present invention will be described.

(A) Maleic Acid Ion Source

A maleic acid ion source (hereinafter, sometimes simply referred to as component (A)) contained in a liquid composition of the present invention forms a complex with a copper ion and serves as an etching agent for copper. The maleic acid ion source is not particularly limited as long as it is capable of supplying a maleic acid ion, preferable examples being maleic acid and maleic anhydride. Maleic anhydrides can be used favorably since they can easily react with water and generate maleic acid. These maleic acid ion sources may be used alone or some of them may be used as a mixture. Among these, maleic acid and maleic anhydride are preferable in terms of solubility into water, good stability in the liquid composition and good etching performance.

The maleic acid ion source (component (A)) is contained, per kilogram of the liquid composition, in a range from a lower limit of preferably 0.01 mol, more preferably 0.02 mol, further preferably 0.04 mol and particularly preferably 0.1 mol to an upper limit of preferably 5 mol, more preferably 4 mol, further preferably 3 mol and particularly preferably 1 mol. Preferably, it is contained in a range of 0.01-5 mol, more preferably in a range of 0.02-4 mol, and particularly preferably in a range of 0.04-3 mol. Moreover, the mix proportion of the maleic acid ion source (component (A)) to the later-described copper ion source (component (B)) is, on molar basis, in a range from a lower limit of preferably 0.01, more preferably 0.02, further preferably 0.1 and particularly preferably 0.2 to an upper limit of preferably 40, more preferably 20, further preferably 10 and particularly preferably 5. Preferably, it is in a range of 0.01-40, more preferably in a range of 0.02-20 and particularly preferably in a range of 0.1-10. As long as the content of the maleic acid ion source (component (A)) in the liquid composition of the present invention is within the above-mentioned range, the copper- and titanium-containing multilayer film can be etched at a good etching rate.

(B) Copper Ion Source

A copper ion source (hereinafter, sometimes simply referred to as component (B)) contained in the liquid composition of the present invention is a component that serves as an oxidant for copper. The copper ion source is not particularly limited as long as it is capable of supplying a copper (II) ion, preferable examples, besides copper, being copper salts such as copper sulfate, copper nitrate, copper acetate, copper hydroxide, cupric chloride, cupric bromide, cupric fluoride, cupric iodide and ammonium copper sulfate. These copper ion sources may be used alone or some of them may be used as a mixture. Among these, copper, copper sulfate, copper nitrate, copper hydroxide and cupric chloride are more preferable and copper sulfate, copper nitrate and copper hydroxide are particularly preferable.

The copper ion source (component (B)) is contained, per kilogram of the liquid composition, in a range from a lower limit of preferably 0.01 mol, more preferably 0.02 mol, further preferably 0.04 mol and particularly preferably 0.1 mol to an upper limit of preferably 5 mol, more preferably 4 mol, further preferably 3 mol and particularly preferably 1 mol. Preferably, it is contained in a range of 0.01-5 mol, more preferably in a range of 0.02-4 mol, and particularly preferably in a range of 0.04-3 mol. As long as the content of the copper ion source (component (B)) in the liquid composition of the present invention is within the above-mentioned range, the copper- and titanium-containing multilayer film can be etched at a good etching rate.

(C) Fluoride Ion Source

A fluoride ion source (hereinafter, sometimes simply referred to as component (C)) contained in the liquid composition of the present invention has a function of enhancing the etching ability of titanium. The fluoride ion source is not particularly limited, preferable examples, besides hydrofluoric acids, being fluoride salts such as ammonium fluoride, ammonium acid fluoride (ammonium hydrogen difluoride), buffered hydrogen fluoride (a mixture of hydrofluoric acid and ammonium fluoride), sodium fluoride, acidic sodium fluoride (sodium hydrogen difluoride), potassium fluoride, acidic potassium fluoride (potassium hydrogen difluoride), calcium fluoride, cupric fluoride and tetramethylammonium fluoride. These fluoride ion sources may be used alone or some of them may be used as a mixture. Among these, hydrofluoric acid, ammonium fluoride, ammonium acid fluoride and buffered hydrogen fluoride are more preferable, and ammonium fluoride and ammonium acid fluoride are particularly preferable.

When a fluoride ion source that has two fluorines in one molecule, such as ammonium acid fluoride or acidic potassium fluoride, is contained as component (C), the content of component (C) is defined to be twice as much as the content of the fluoride ion source.

In addition, the fluoride ion source contained in the liquid composition may not be dissociated as fluoride ions ($F^-$) or may be present as difluoride monohydrate ions ($HF_2^-$) in the liquid, the molar number assuming that they are completely dissociated is defined as the content of component (C).

Additionally, fluoride salts of copper such as cupric fluoride not only have the function as component (C) but also serve as the above-described copper ion source. For example, when a fluoride salt of copper is contained in the liquid composition of the present invention, the content of component (C) is the total content of the fluoride salt of copper and other fluoride ion source.

The fluoride ion source (component (C)) is contained, per kilogram of the liquid composition, in a range from a lower limit of preferably 0.001 mol, more preferably 0.002 mol, further preferably 0.01 mol and particularly preferably 0.1 mol to an upper limit of preferably 5 mol, more preferably 4 mol, further preferably 3 mol and particularly preferably 1 mol. Preferably, it is contained in a range of 0.001-5 mol, more preferably in a range of 0.002-4 mol, and particularly preferably in a range of 0.01-3 mol. The mix proportion of the fluoride ion source (component (C)) to the copper ion source (component (B)), on molar basis, is in a range from a lower limit of preferably 0.01, more preferably 0.02, further preferably 0.1 and particularly preferably 0.2 to an upper limit of preferably 40, more preferably 20, further preferably 10, particularly preferably 5 and still more preferably 3. Preferably, it is in a range of 0.01-40, more preferably in a range of 0.02-20 and particularly preferably in a range of 0.1-10. As long as the content of the fluoride ion source (component (C)) in the liquid composition of the present invention is within the above-mentioned range, the copper- and titanium-containing multilayer film can be etched at a good etching rate.

(D) Carboxylic Acid Ion Source Other than Maleic Acid Ion

If necessary, the liquid composition according to the present invention may contain a carboxylic acid ion source other than a maleic acid ion (hereinafter, sometimes simply referred to as component (D)). The carboxylic acid ion source other than a maleic acid ion serves as a ligand to a copper ion, enhances stability of the liquid composition used for etching a copper- and titanium-containing multilayer film, and has a function of stabilizing the etching rate. Moreover, it is also effective in preventing occurrence of residues precipitated upon diluting the liquid composition with water in the step of rinsing with water following etching.

The carboxylic acid ion source other than a maleic acid ion (component (D)) is not particularly limited as long as it is capable of supplying a carboxylic acid ion other than a maleic acid ion, preferable examples being monocarboxylic acids such as formic acid, acetic acid, propionic acid, butyric acid and isobutyric acid; dicarboxylic acids such as oxalic acid, malonic acid and succinic acid; aminocarboxylic acids such as glycine and alanine; hydroxycarboxylic acids such as glycolic acid, lactic acid, 2-hydroxyisobutyric acid, citric acid, tartaric acid and malic acid; and carboxylates thereof. These carboxylic acid ion sources other than a maleic acid ion may be used alone or some of them may be used as a mixture. In addition, since carboxylic acid anhydrides such as acetic anhydride and propionic anhydride generate carboxylic acid through reaction with water, a carboxylic acid anhydride may also be used suitably as component (D). Furthermore, since carboxylic esters such as ethyl acetate, propyl acetate, ethyl propionate, dimethyl malonate, diethyl malonate, dimethyl succinate and diethyl succinate generate carboxylic acid through hydrolysis reaction, a carboxylic ester may also be used suitably as component (D). Among these, acetic acid, propionic acid, glycolic acid, malonic acid, succinic acid, lactic acid, citric acid, tartaric acid, malic acid, carboxylate thereof and acetic anhydride are more preferable, and acetic acid, acetic anhydride, glycolic acid, malonic acid, succinic acid, lactic acid, and citric acid are particularly preferable in terms of availability and the like.

Moreover, copper salts of carboxylic acid such as copper acetate not only have a function as component (D) but also serve as the above-described copper ion source. For example, when a copper salt of carboxylic acid is contained in the liquid composition of the present invention, the content of component (D) is the total content of the copper salt of carboxylic acid and other carboxylic acid ion source.

Additionally, since a carboxylic acid anhydride in which two carboxylic acid molecules such as acetic anhydride or propionic anhydride are in a form of dehydration condensation generates two carboxylic acid molecules through reaction with water, when these carboxylic acid anhydrides are contained as component (D), the content of component (D) is defined to be twice as much as the content of the carboxylic acid anhydride.

The carboxylic acid ion source other than a maleic acid ion (component (D)) is contained, per kilogram of the liquid composition, preferably in a range of 0-5 mol, more preferably in a range of 0-4 mol and particularly preferably in a range of 0-3 mol. Moreover, the mix proportion of the carboxylic acid ion source other than a maleic acid ion (component (D)) to the copper ion source (component (B)) is, on molar basic, is preferably in a range of 0-40, more preferably in a range of 0-20, further preferably in a range of 0-10 and particularly preferably in a range of 0-5. As long as the content of the carboxylic acid ion source other than a maleic acid ion (component (D)) in the liquid composition of the present invention is within the above-mentioned range, the copper- and titanium-containing multilayer film can be etched at a better etching rate.

(E) Halide Ion Source Other than Fluoride Ion

If necessary, the liquid composition according to the present invention may contain a halide ion source other than a fluoride ion (hereinafter, sometimes simply referred to as component (E)). The halide ion source other than a fluoride ion has a function of promoting copper etching and can be added to adjust the etching rate.

The halide ion source other than a fluoride ion (component (E)) is not particularly limited as long as it is capable of supplying a halide ion other than a fluoride ion, preferable examples being hydrohalic acids such as hydrochloric acid and hydrobromic acid; chloride salts such as ammonium chloride, sodium chloride, potassium chloride, calcium chloride and cupric chloride; and bromide salts such as ammonium bromide, sodium bromide, potassium bromide and calcium bromide. These halide ion sources other than fluoride ions may be used alone or some of them may be used as a mixture. Among these, hydrochloric acid, hydrobromic acid, ammonium chloride, potassium chloride, cupric chloride, ammonium bromide and potassium bromide are more preferable, and hydrochloric acid, hydrobromic acid, ammonium chloride, potassium chloride, cupric chloride and potassium bromide are particularly preferable in terms of availability and the like.

Furthermore, a halide salt of copper such as cupric chloride not only has a function as component (E) but also serves as the above-described copper ion source. For example, when a halide salt of copper is contained in the liquid composition of the present invention, the content of component (E) is the total content of the halide salt of copper and other halide ion source.

The halide ion source other than a fluoride ion (component (E)) is contained, per kilogram of the liquid composition, preferably in a range of 0-5 mol, more preferably in a range of 0-4 mol and particularly preferably in a range of 0-3 mol. In addition, the mix proportion of the halide ion source other than a fluoride ion (component (E)) to the copper ion source (component (B)) is, on molar basis, preferably in a range of 0-40, more preferably in a range of 0-20, further preferably in a range of 0-10 and particularly preferably in a range of 0-5. If the content of the halide ion source other than a fluoride ion (component (E)) in the liquid composition of the present invention is within the above-mentioned range, the copper- and titanium-containing multilayer film can be etched at a better etching rate.

The pH value of the above-described liquid composition according to the present invention is in a range of 0-7. By making the pH value of the liquid composition to lie within the above-mentioned range, the etching rate and the wiring configuration becomes better. If the pH value is less than 0, the etching time becomes difficult to control because the etching rate is too high, which is unfavorable. On the other hand, if the pH value exceeds 7, productivity is decreased because the etching rate tends to decrease, which is unfavorable.

pH Adjuster

If necessary, the liquid composition according to the present invention may contain a pH adjuster in order to adjust the pH value. The pH adjuster is not particularly limited as long as it does not hinder the above-described effects of the liquid composition, preferable examples being ammonia; metal hydroxides such as sodium hydroxide and potassium hydroxide; amines such as isopropylamine and tertiary butylamine; hydroxylamines such as hydroxylamine; alkylammonium hydroxides such as tetramethylammonium hydroxide; inorganic acids such as hydrochloric acid, sulfuric acid, nitric acid, phosphoric acid and perchloric acid; and sulfonic acids such as methanesulfonic acid and trifluoromethanesulfonic acid. These pH adjusters may be used alone or some of them may be used as a mixture. Among these, ammonia, potassium hydroxide, isopropylamine, tertiary butylamine, tetramethylammonium hydroxide, hydrochloric acid, sulfuric acid, nitric acid, phosphoric acid, perchloric acid and methanesulfonic acid are more preferable. In particular, ammonia, potassium hydroxide, hydrochloric acid, sulfuric acid, nitric acid, perchloric acid and methanesulfonic acid are preferable.

An acid that contains a halide ion, such as hydrochloric acid, not only has a function as a pH adjuster but also serves as the above-described halide ion source other than a fluoride ion.

The content of the pH adjuster in the liquid composition according to the present invention can appropriately be determined according to the contents of other components such that the intended pH value of the liquid composition is obtained.

Other than the above-described components (A), (B) and (C), the optionally-added components (D) and (E) and the pH adjuster, the liquid composition according to the present invention may contain water and other various additives generally used for a liquid etching composition within a range that does not hinder the above-described effects of the liquid composition. For example, water is preferably removed of metal ions, organic impurities, particles and the like by distillation, ion-exchange, filtering, adsorption treatment or the like, more preferably it is pure water and particularly preferably it is ultrapure water.

The liquid composition according to the present invention may contain a known additive as an adjuster for the etching rate. For example, it may contain, as an etching rate reducing inhibitor for copper, an azole compound such as benzotriazole, 5-amino-1H-tetrazole, imidazole or pyrazole, or a phosphoric acid.

<Method for Etching Copper- and Titanium-Containing Multilayer Film>

An etching method according to the present invention is a method for etching a copper- and titanium-containing multilayer film, comprising the step of bringing the above-described liquid composition into contact with the above-described multilayer film. According to the present invention, a multilayer film containing copper and titanium can be etched together at a good etching rate. In addition, according to the method of the present invention, a good wiring configuration can be obtained.

The etching method of the present invention targets a copper- and titanium-containing multilayer film as the object to be etched. According to the present invention, a multilayer film as the object to be etched has a multilayer structure comprising a layer made of copper or a compound containing copper as a primary component and a layer made of titanium or a compound containing titanium as a primary component. Examples of the multilayer film include a two-layer film in which a layer made of copper or a compound containing copper as a primary component and a layer made of titanium or a compound containing titanium as a primary component are laminated, and a three-layer film in which a layer made of titanium or a compound containing titanium as a primary component, a layer made of copper or a compound containing copper as a primary component and a layer made of titanium or a compound containing titanium as a primary component are laminated. In particular, a three-layer film in which a layer made of titanium or a compound containing titanium as a primary component, a layer made of copper or a compound containing copper as a primary component, a layer made of titanium or a compound containing titanium as a primary component are laminated in this order is particularly preferable in terms of bringing out effective performance of the liquid composition of the present invention.

Examples of copper or the compound made of copper as a primary component include copper (metal), copper alloys, copper oxide and copper nitride. Examples of titanium or the compound made of titanium as a primary component include titanium (metal), titanium alloys, and oxides or nitrides thereof.

The object to be etched may be obtained, for example, by: sequentially laminating a layer made of titanium, a layer made of copper and a layer made of titanium on a substrate (for example, a glass substrate) to form a multilayer film, i.e., a three-layer film; applying a resist thereon; and exposing and transferring the pattern mask for development to form a desired resist pattern. Other than the above-mentioned glass substrate, the substrate on which the multilayer film is formed may be, for example, a substrate having a layer structure in which gate wiring is formed on a glass plate, and an insulating film made of silicon nitride or the like is provided on the gate wiring. According to the present invention, the above-described liquid composition is brought into contact with the object to be etched so as to etch the multilayer film to form desired multilayer-film wiring, thereby obtaining multilayer-film wiring provided with a multilayer film comprising a layer made of titanium or a compound containing titanium as a primary component and a layer made of copper or a compound containing copper as a primary component. Such copper- and titanium-containing multilayer-film wiring may preferably be used as wiring or the like for a display device such as a flat panel display.

The process of bringing the liquid composition into contact with an object to be etched is not particularly limited. For example, a wet etching process such as a process in which the liquid composition is brought into contact with the object through dropping (sheet-fed spin processing) or spraying, or a process in which the object to be etched is immersed in the liquid composition can be employed. According to the present invention, any process can be used for etching. Especially, the process in which the liquid composition is brought into contact with the object to be etched through spraying is preferably employed. The process in which the liquid composition is brought into contact with the object through spraying may be a process in which the liquid composition is downwardly sprayed from above the object to be etched, or a process in which the liquid composition is upwardly sprayed from underneath the object to be etched. Upon this, the spray nozzle may be secured or made to perform swinging or sliding movement. Alternatively, the spray nozzle may be disposed vertically downward or tilted. The object to be etched may be secured or made to perform an oscillating or rotating movement, and may be disposed horizontally or tilted.

The temperature of the liquid composition upon use thereof is preferably 10-70° C. and particularly preferably 20-50° C. Since a good etching rate can be obtained if the temperature of the liquid composition is 10° C. or higher, high production efficiency can be achieved. Meanwhile, at 70° C. or lower, change in the composition of the liquid can be suppressed, thereby maintaining the etching conditions constant. Although the etching rate can be increased by increasing the temperature of the liquid composition, an optimal treatment temperature can appropriately be determined considering minimum change in the composition of the liquid composition, and else.

EXAMPLES

Hereinafter, the present invention will be described in more detail by way of examples. The scope of the present invention, however, should not be limited in any way to these examples.

Reference Example 1

Preparation of Titanium/Copper/Titanium/Glass Substrate

Titanium was sputtered onto a glass substrate (dimensions: 150 mm×150 mm) to form a film of a layer made of titanium (metal) (titanium film thickness: 500 Å). Next, copper was sputtered to form a film of a layer made of copper (metal) (copper film thickness: 4000 Å). Then, titanium was again sputtered to form a film of a layer made of titanium (metal) (titanium film thickness: 200 Å), thereby obtaining a three-layer film structure of titanium/copper/titanium. A resist was further applied and a linear pattern mask (line width: 20 μm) was exposed and transferred for subsequent development, thereby preparing a titanium/copper/titanium/glass substrate formed with a resist pattern.

Reference Example 2

Preparation of Copper/Titanium/Glass Substrate

Titanium was sputtered onto a glass substrate (dimensions: 150 mm×150 mm) to form a film of a layer made of titanium (metal) (titanium film thickness: 500 Å). Next, copper was sputtered to form a film of a layer made of copper (metal) (copper film thickness: 4000 Å), thereby obtaining a two-layer structure of copper/titanium. A resist was further applied and a linear pattern mask (line width: 20 μm) was exposed and transferred for subsequent development, thereby preparing a copper/titanium/glass substrate formed with a resist pattern.

Example 1

To a polypropylene container with a volume of 100 mL, 86.68 g of pure water, 5.00 g of maleic acid (Wako Pure Chemical Industries, special grade, molecular weight 116.1) as the maleic acid ion source (A), 7.82 g of copper sulfate (II) pentahydrate (Wako Pure Chemical Industries, special grade, molecular weight 249.7) as the copper ion source (B), and 0.50 g of ammonium acid fluoride (Morita Chemical Industries, molecular weight 57.04) as one of the fluoride ion sources (C) were added and then agitated. The dissolution of each component was confirmed, thereby preparing a liquid composition.

The contents of the respective components in the liquid composition obtained as described above were as follows: component (A) was 0.086 mol and component (B) was 0.313 mol, per kilogram of the liquid composition, where the mix proportion (molar ratio) of component (A) to component (B) was 0.27. The content of component (C) per kilogram of the liquid composition was 0.175 mol, as calculated to be twice the amount of ammonium acid fluoride. The mix proportion (molar ratio) of component (C) to component (B) was 0.56. The pH value of the resulting liquid composition was 3.0.

This liquid composition was used to perform spray treatment at 35° C. on the titanium/copper/titanium/glass substrate having the resist pattern obtained in Reference Example 1 formed thereon, using a small-sized etching equipment. The titanium/copper/titanium/glass substrate was disposed horizontally such that the film-formed plane faces up while the spray nozzle was secured to point vertically downwards.

The time that took until the part of the titanium/copper/titanium laminated film that was not covered with the resist disappeared to expose the transparent glass substrate (just-etch time) was visually confirmed to be 152 seconds. The titanium/copper/titanium/glass substrate etched for 228 seconds (50% overetching condition) was rinsed with pure water, dried with a blower, and observed using an optical microscopic. As a result, the exposed part of the titanium/copper/titanium laminated film other than the part covered with the patterned resist was confirmed to have completely disappeared. The optical micrograph is shown in FIG. 1.

Furthermore, this liquid composition was used to perform spray treatment at 35° C. on the copper/titanium/glass substrate having the resist pattern obtained in Reference Example 2 formed thereon, using a small-sized etching equipment. The copper/titanium/glass substrate was disposed horizontally such that the film-formed plane faces up while the spray nozzle was secured to point vertically downwards.

Figure 2:
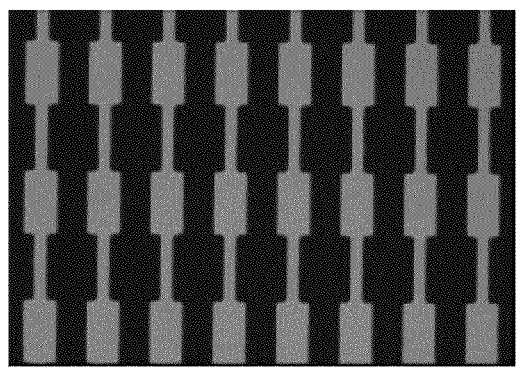
FIG. 2 An optical micrograph of a copper/titanium/glass substrate having the resist pattern obtained in Reference Example 2 formed thereon, which had been etched using the liquid composition of Example 1.

The time that took until the part of the copper/titanium laminated film that was not covered with the resist disappeared to expose the transparent glass substrate (just-etch time) was visually confirmed to be 110 seconds. The copper/ titanium/glass substrate etched for 165 seconds (50% overetching condition) was rinsed with pure water, dried with a blower, and observed using an optical microscopic. As a result, the exposed part of the copper/titanium laminated film other than the part covered with the patterned resist was confirmed to have completely disappeared. The optical micrograph is shown in FIG. 2.

Examples 2-6

In Examples 2-6, liquid compositions were prepared in the same manner as Example 1 except that the mix amounts of the respective components were as shown in Table 1. The liquid compositions were used to perform spray treatment (50% overetching condition) on titanium/copper/titanium/glass substrates having the resist pattern obtained in Reference Example 1 formed thereon. The time that took until the part of the titanium/copper/titanium laminated film that was not covered with the resist disappeared to expose the transparent glass substrate (just-etch time) is shown in Table 1. In all of the cases using any liquid composition, the exposed part of the titanium/copper/titanium laminated film other than the part covered with the patterned resist was confirmed to have completely disappeared.

Examples 7-12

In Examples 7-12, liquid compositions were prepared in the same manner as Example 1 except that the mix amounts of the respective components were as shown in Table 2. The liquid compositions were used to perform spray treatment (50% overetching condition) on titanium/copper/titanium/glass substrates having the resist pattern obtained in Reference Example 1 formed thereon. The time that took until the part of the titanium/copper/titanium laminated film that was not covered with the resist disappeared to expose the transparent glass substrate (just-etch time) is shown in Table 2. In all of the cases using any liquid composition, the exposed part of the titanium/copper/titanium laminated film other than the part covered with the patterned resist was confirmed to have completely disappeared.

In addition, spray treatment was performed in the same manner as Example 1 on a copper/titanium/glass substrate having the resist pattern obtained in Reference Example 2 formed thereon, using the liquid composition of Example 7. The time that took until the part of the copper/titanium laminated film that was not covered with the resist disappeared to expose the transparent glass substrate (just-etch time) was visually confirmed to be 243 seconds. The copper/titanium/glass substrate etched for 365 seconds (50% overetching condition) was observed using an optical microscopic. As a result, the exposed part of the copper/titanium laminated film other than the part covered with the patterned resist was confirmed to have completely disappeared.

Comparative Examples 1-6

In Comparative Examples 1-6, liquid compositions were prepared in the same manner as Example 1 except that the mix amounts of the respective components were as shown in Table 3. The liquid compositions were used to perform spray treatment on titanium/copper/titanium/glass substrates having the resist pattern obtained in Reference Example 1 formed thereon. When the liquid composition of Comparative Example 1 that did not contain a fluoride ion source was used, the exposed part of the titanium/copper/titanium laminated film other than the part covered with the patterned resist was confirmed to have not completely disappeared even after performing the spray treatment for 500 seconds. Also, when the liquid compositions of Comparative Examples 2-6 that did not contain a maleic acid ion source were used, the exposed parts of the titanium/copper/titanium laminated films other than the parts covered with the patterned resist were confirmed to have not completely disappeared even after performing the spray treatment for 500 seconds.

Comparative Examples 7-9

Figure 3:
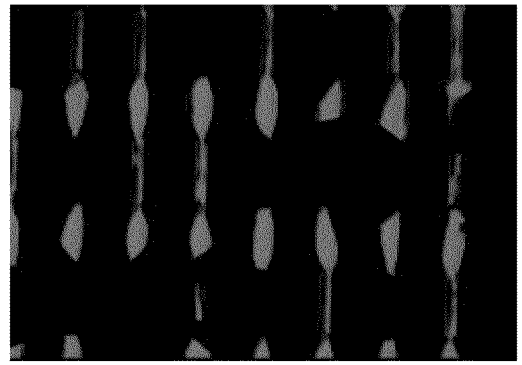
FIG. 3 An optical micrograph of a titanium/copper/titanium/glass substrate having the resist pattern obtained in Reference Example 1 formed thereon, which had been etched using the liquid composition of Comparative Example 7.

In Comparative Examples 7-9, liquid compositions were prepared in the same manner as Example 1 except that the mix amounts of the respective components were as shown in Table 4. The liquid compositions were used to perform spray treatment on titanium/copper/titanium/glass substrates having the resist pattern obtained in Reference Example 1 formed thereon. When the liquid composition of Comparative Example 7 that did not contain a maleic acid source but a chloride ion source was used, the time that took until the part of the copper/titanium laminated film that was not covered with the resist disappeared to expose the transparent glass substrate (just-etch time) was visually confirmed to be 41 seconds. The titanium/copper/titanium/glass substrate etched for 62 seconds (50% overetching condition) was rinsed with pure water, dried with a blower, and observed using an optical microscopic. As a result, the wiring configuration had disconnection, and not only the exposed part of the titanium/copper/titanium laminated film but also the part covered with the patterned resist was confirmed to have disappeared. The optical micrograph is shown in FIG. 3.

Figure 4:
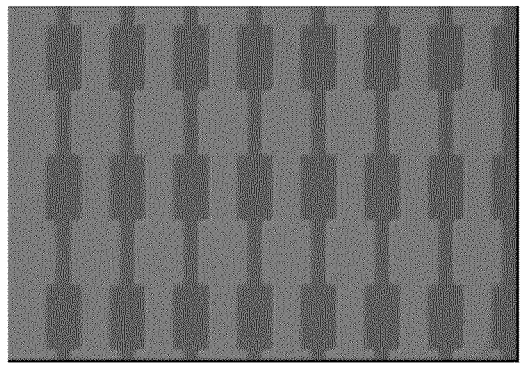
FIG. 4 An optical micrograph of a titanium/copper/titanium/glass substrate having the resist pattern obtained in Reference Example 1 formed thereon, which had been etched using the liquid composition of Comparative Example 8.

Also, when the liquid compositions of Comparative Examples 8 and 9 that did not contain a maleic acid ion source were used, the exposed parts of the titanium/copper/titanium laminated films other than the parts covered with the patterned resist were confirmed to have not completely disappeared even after performing the spray treatment for 500 seconds. The optical micrograph of the case using the liquid composition of Comparative Examples 8 is shown in FIG. 4.

TABLE 1

| Composition of liquid composition (mol/Kg) | Example 1 | Example 2 | Example 3 | Example 4 | Example 5 | Example 6 |
| --- | --- | --- | --- | --- | --- | --- |
| Component A: Maleic acid ion source | Maleic acid 0.086 | Maleic acid 0.215 | Maleic acid 0.431 | Maleic acid 0.646 | Maleic acid 0.431 | Maleic acid 0.431 |
| Component B: Copper ion source | Copper sulfate 0.313 | Copper sulfate 0.313 | Copper sulfate 0.313 | Copper sulfate 0.157 | Copper sulfate 0.313 | Copper sulfate 0.157 |
| Component | Ammonium | Ammonium | Ammonium | Ammonium | Ammonium | Ammonium |

TABLE 1-continued

| Composition of liquid composition (mol/Kg) | Example 1 | Example 2 | Example 3 | Example 4 | Example 5 | Example 6 |
|---|---|---|---|---|---|---|
| C: Fluoride ion source | acid fluoride (x2) 0.175 | acid fluoride (x2) 0.175 | acid fluoride (x2) 0.175 | acid fluoride (x2) 0.175 | acid fluoride (x2) 0.175 | acid fluoride (x2) 0.175 |
| Component D: Carboxylic acid ion source | — | — | — | — | Citric acid 0.052 | Citric acid 0.156 |
| Component E: Halide ion source | — | — | — | — | — | Hydrochloric acid 0.137 |
| pH adjuster | — | Ammonia 0.038 | Ammonia 0.131 | Potassium hydroxide 0.345 | Potassium hydroxide 0.280 | Potassium hydroxide 0.357 |
| Molar ratio of Component A/Component B | 0.27 | 0.69 | 1.37 | 4.12 | 1.37 | 2.75 |
| Molar ratio of Component C/Component B | 0.56 | 0.56 | 0.56 | 1.12 | 0.56 | 1.12 |
| Molar ratio of Component D/Component B | — | — | — | — | 0.17 | 1.00 |
| Molar ratio of Component E/Component B | — | — | — | — | — | 0.88 |
| pH value of liquid composition | 3.0 | 3.0 | 3.0 | 3.0 | 3.0 | 3.0 |
| Just-etch time (sec) | 152 | 155 | 185 | 264 | 171 | 73 |
| Etching rate (μm/min) | 0.186 | 0.182 | 0.152 | 0.107 | 0.165 | 0.386 |
| Wiring configuration after etching | Good | Good | Good | Good | Good | Good |

*"—" in the table means that the indicated component is not added

TABLE 2

| Composition of liquid composition (mol/Kg) | Example 7 | Example 8 | Example 9 | Example 10 | Example 11 | Example 12 |
|---|---|---|---|---|---|---|
| Component A: Maleic acid ion source | Maleic acid 0.215 | Maleic acid 0.431 | Maleic acid 0.431 | Maleic acid 0.431 | Maleic acid 0.431 | Maleic acid 0.431 |
| Component B: Copper ion source | Copper sulfate 0.313 | Copper sulfate 0.157 | Copper sulfate 0.157 | Copper sulfate 0.157 | Copper nitrate 0.489 | Copper hydroxide 0.245 |
| Component C: Fluoride ion source | Ammonium acid fluoride (x2) 0.175 | Ammonium acid fluoride (x2) 0.175 | Ammonium acid fluoride (x2) 0.175 | Ammonium acid fluoride (x2) 0.175 | Ammonium acid fluoride (x2) 0.175 | Ammonium acid fluoride (x2) 0.175 |
| Component D: Carboxylic acid ion source | — | Citric acid 0.156 | Citric acid 0.156 | Citric acid 0.156 | Citric acid 0.052 | Citric acid 0.156 |
| Component E: Halide ion source | — | Hydrochloric acid 0.137 | Hydrochloric acid 0.137 | Hydrochloric acid 0.137 | — | Hydrochloric acid 0.137 |
| pH adjuster | Nitric acid 0.756 | Nitric acid 0.437 | Potassium hydroxide 0.713 | Potassium hydroxide 1.07 | Potassium hydroxide 0.280 | Potassium hydroxide 0.357 |
| Molar ratio of Component A/Component B | 0.69 | 2.75 | 2.75 | 2.75 | 0.88 | 1.76 |
| Molar ratio of Component C/Component B | 0.56 | 1.12 | 1.12 | 1.12 | 0.56 | 1.12 |

TABLE 2-continued

| Composition of liquid composition (mol/Kg) | Example 7 | Example 8 | Example 9 | Example 10 | Example 11 | Example 12 |
|---|---|---|---|---|---|---|
| Molar ratio of Component D/Component B | — | 1.00 | 1.00 | 1.00 | 0.17 | 1.00 |
| Molar ratio of Component E/Component B | — | 0.88 | 0.88 | 0.88 | — | 0.88 |
| pH value of liquid composition | 1.6 | 1.6 | 3.8 | 4.6 | 2.5 | 3.8 |
| Just-etch time (sec) | 299 | 33 | 55 | 215 | 172 | 42 |
| Etching rate (μm/min) | 0.094 | 0.868 | 0.517 | 0.131 | 0.164 | 0.680 |
| Wiring configuration after etching | Good | Good | Good | Good | Good | Good |

*"—" in the table means that the indicated component is not added

TABLE 3

| Composition of liquid composition (mol/Kg) | Comparative Example 1 | Comparative Example 2 | Comparative Example 3 | Comparative Example 4 | Comparative Example 5 | Comparative Example 6 |
|---|---|---|---|---|---|---|
| Component A: Maleic acid ion source | Maleic acid 0.086 | — | — | — | — | — |
| Component B: Copper ion source | Copper sulfate 0.313 | Copper sulfate 0.313 | Copper sulfate 0.313 | Copper sulfate 0.313 | Copper sulfate 0.313 | Copper sulfate 0.313 |
| Component C: Fluoride ion source | — | Ammonium acid fluoride (x2) 0.175 | Ammonium acid fluoride (x2) 0.175 | Ammonium acid fluoride (x2) 0.175 | Ammonium acid fluoride (x2) 0.175 | Ammonium acid fluoride (x2) 0.175 |
| Component D: Carboxylic acid ion source | — | — | Citric acid 0.104 | Acetic acid 0.166 | Succinic acid 0.169 | Lactic acid 0.111 |
| Component E: Halide ion source | — | — | — | — | — | — |
| pH adjuster | — | — | — | — | — | — |
| Molar ratio of Component A/Component B | 0.27 | — | — | — | — | — |
| Molar ratio of Component C/Component B | — | 0.56 | 0.56 | 0.56 | 0.56 | 0.56 |
| Molar ratio of Component D/Component B | — | — | 0.33 | 0.53 | 0.54 | 0.35 |
| Molar ratio of Component E/Component B | — | — | — | — | — | — |
| pH value of liquid composition | 1.7 | 3.7 | 3.2 | 3.8 | 3.6 | 3.4 |
| Just-etch time (sec) | >500 | >500 | >500 | >500 | >500 | >500 |
| Etching rate (μm/min) | <0.056 | <0.056 | <0.056 | <0.056 | <0.056 | <0.056 |
| Wiring configuration after etching | Etching incomplete | Etching incomplete | Etching incomplete | Etching incomplete | Etching incomplete | Etching incomplete |

*"—" in the table means that the indicated component is not added

TABLE 4

| Composition of liquid composition (mol/Kg) | Comparative Example 7 | Comparative Example 8 | Comparative Example 9 |
|---|---|---|---|
| Component A: Maleic acid ion source | — | — | — |
| Component B: Copper ion source | Copper sulfate 0.313 | Copper sulfate 0.313 | Copper sulfate 0.313 |
| Component C: Fluoride ion source | Ammonium acid fluoride (×2) 0.175 | Ammonium acid fluoride (×2) 0.175 | Ammonium acid fluoride (×2) 0.175 |
| Component D: Carboxylic acid ion source | — | — | — |
| Component E: Halide ion source | Hydrochloric acid 0.137 | — | — |
| pH adjuster | — | Sulfuric acid 0.204 | Nitric acid 0.263 |
| Molar ratio of Component A/Component B | — | — | — |
| Molar ratio of Component C/Component B | 0.56 | 0.56 | 0.56 |
| Molar ratio of Component D/Component B | — | — | — |
| Molar ratio of Component E/Component B | — | — | — |
| pH value of liquid composition | 2.8 | 1.9 | 1.9 |
| Just-etch time (sec) | 41 | >500 | >500 |
| Etching rate (μm/min) | 0.696 | <0.056 | <0.056 |
| Wiring configuration after etching | Presence of wiring disconnection | Etching incomplete | Etching incomplete |

*"—" in the table means that the indicated component is not added

As can be appreciated from the evaluation results shown above, all of the liquid compositions of Examples were capable of etching a multilayer film containing copper and titanium at a good etching rate. The wiring configuration after etching was also good. Moreover, there were no generation of gas or heat from the liquid composition and no odor upon etching. Thus, etching can be performed stably.

INDUSTRIAL APPLICABILITY

A liquid composition according to the present invention can suitably be used for etching a multilayer film containing copper and titanium such that wiring having a copper- and titanium-containing multilayer structure can be etched together at a good etching rate, thereby achieving high productivity.

The invention claimed is:

1. A liquid composition used for etching a multilayer film comprising a layer made of copper or a compound containing copper as a primary component and a layer made of titanium or a compound containing titanium as a primary component, the liquid composition comprising:
(A) a maleic acid ion source;
(B) a copper ion source; and
(C) a fluoride ion source,
wherein the pH value is 0-7.

2. The liquid composition according to claim 1, wherein the maleic acid ion source (A) is at least one species selected from the group consisting of maleic acid and maleic anhydride, where the concentration thereof is 0.01-5 mol/kg.

3. The liquid composition according to claim 1, wherein the copper ion source (B) is at least one species selected from the group consisting of copper, copper sulfate, copper nitrate, copper hydroxide and cupric chloride, where the concentration thereof is 0.01-5 mol/kg.

4. The liquid composition according to claim 1, wherein the mix proportion of the maleic acid ion source (A) to the copper ion source (B) is 0.01-40 on molar basis.

5. The liquid composition according to claim 1, wherein the fluoride ion source (C) is at least one species selected from the group consisting of hydrofluoric acid, ammonium fluoride, ammonium acid fluoride and buffered hydrogen fluoride, where the concentration thereof is 0.001-5 mol/kg.

6. The liquid composition according to claim 1, further comprising a carboxylic acid ion source (D) other than maleic acid ion.

7. The liquid composition according to claim 6, wherein the carboxylic acid ion source (D) other than maleic acid is at least one species selected from the group consisting of acetic acid, glycolic acid, malonic acid, succinic acid, lactic acid, citric acid, carboxylates thereof and acetic anhydride, where the concentration thereof is 0-5 mol/kg.

8. The liquid composition according to claim 1, further comprising a halide ion source (E) other than a fluoride ion.

9. The liquid composition according to claim 8, wherein the halide ion source (E) other than a fluoride ion is at least one species selected from the group consisting of hydrochloric acid, hydrobromic acid, ammonium chloride, potassium chloride, cupric chloride and potassium bromide, where the concentration thereof is 0-5 mol/kg.

10. The liquid composition according to claim 1, further comprising a pH adjuster.

11. A method for etching a multilayer film comprising a layer made of copper or a compound containing copper as a primary component and a layer made of titanium or a compound containing titanium as a primary component, the method comprising the step of bringing the multilayer film into contact with the liquid composition according to claim 1.

12. The etching method according to claim 11, wherein the multilayer film is a two-layer film in which a layer made of titanium or a compound containing titanium as a primary component is laminated with a layer made of copper or a compound containing copper as a primary component.

13. The etching method according to claim 11, wherein the multilayer film is a three-layer film in which a layer made of titanium or a compound containing titanium as a primary component, a layer made of copper or a compound containing copper as a primary component and a layer made of titanium or a compound containing titanium as a primary component are laminated in this order.

14. A method for manufacturing multilayer-film wiring comprising at least a layer made of titanium or a compound containing titanium as a primary component and a layer made of copper or a compound containing copper as a primary component on a substrate, the method comprising the steps of:
providing a layer made of titanium or a compound containing titanium as a primary component and a layer made of copper or a compound containing copper as a primary component on the substrate to form a multilayer film;

covering the multilayer film with a resist to form a resist film;

exposing and developing the resist film to form a predetermined resist pattern, thereby forming an object to be etched; and bringing the object to be etched into contact with the liquid composition according to claim 1 to etch the multilayer film, thereby forming multilayer-film wiring.

15. A substrate provided with multilayer-film wiring comprising at least a layer made of titanium or a compound containing titanium as a primary component and a layer made of copper or a compound containing copper as a primary component, wherein the substrate is manufactured according to the method for manufacturing multilayer-film wiring according to claim 14.

* * * * *